United States Patent
Cheng et al.

(10) Patent No.: US 8,658,881 B2
(45) Date of Patent: Feb. 25, 2014

(54) RESONANT THERMOELECTRIC GENERATOR

(76) Inventors: Kan K. Cheng, Newark, CA (US); Mindy M. Cheng, Newark, CA (US)

( * ) Notice: Subject to any disclaimer, the term of this patent is extended or adjusted under 35 U.S.C. 154(b) by 1947 days.

(21) Appl. No.: 11/562,470

(22) Filed: Nov. 22, 2006

(65) Prior Publication Data

US 2008/0115818 A1 May 22, 2008

(51) Int. Cl.
*H01L 35/30* (2006.01)

(52) U.S. Cl.
USPC ............ 136/205; 136/293; 310/306; 310/308

(58) Field of Classification Search
USPC ............................. 136/205, 293; 310/306, 308
See application file for complete search history.

(56) References Cited

U.S. PATENT DOCUMENTS

| | | | | |
|---|---|---|---|---|
| 3,913,000 | A * | 10/1975 | Cardwell, Jr. .................... | 363/20 |
| 4,853,832 | A * | 8/1989 | Stuart .............................. | 363/17 |
| 5,770,911 | A | 6/1998 | Cheng | |
| 2006/0243317 | A1 * | 11/2006 | Venkatasubramanian .... | 136/206 |

* cited by examiner

*Primary Examiner* — Jonathan Johnson
*Assistant Examiner* — Thanh-Truc Trinh
(74) *Attorney, Agent, or Firm* — Douglas L. Weller

(57) ABSTRACT

A thermoelectric generator comprises an electrical circuit having two or more thermocouple junctions (600, 615), a switch (620), a controller (640), and a series resonant circuit consisting of a capacitor (625) and an inductor in the form of a transformer (630). The thermocouple junctions operate between two temperature reservoirs (605, 610) operating at temperatures T2 and T1, respectively, that are sufficiently different to enable the circuit to supply power to a load (635). Using sense lines (650, 655) the controller forces the switch to advance to the next throw at the proper time, forcing the circuit to operate at or near resonance. With each operation of the switch, one junction at a time is connected to the resonant circuit, while one or more junctions are left in an open-circuit condition. By allowing the temporarily disconnected junctions sufficient time to reach thermal equilibrium with the temperature reservoirs, isothermal equilibrium is achieved. By reversing the polarity of each subsequently-connected junction, electrons in the thermally-equilibrated junctions experience a very rapid adiabatic expansion or compression when each junction is connected. The result is a thermoelectric generator that operates with an efficiency that is greater than the prior-art. Power regulation is accomplished through adjustments to the strength of the load and the temperatures of the reservoirs.

18 Claims, 4 Drawing Sheets

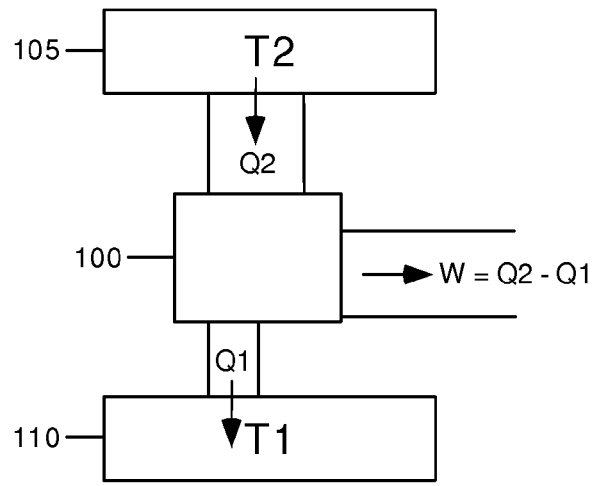
Fig. 1--Prior Art
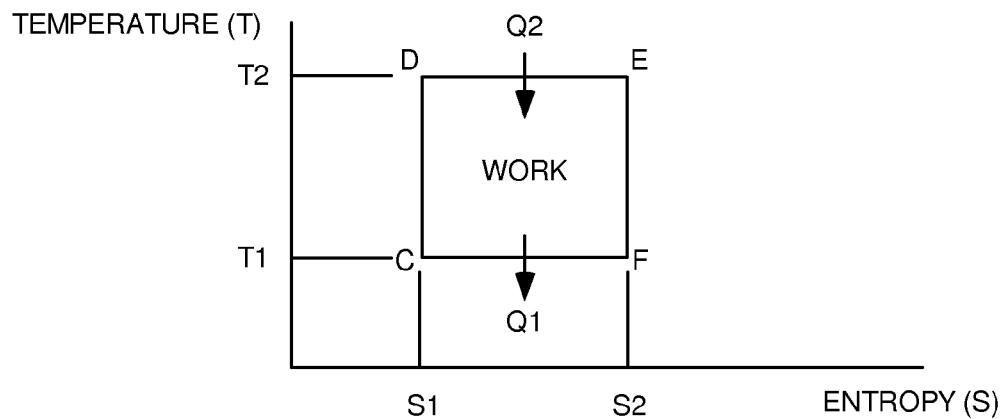
Fig. 2--Prior Art
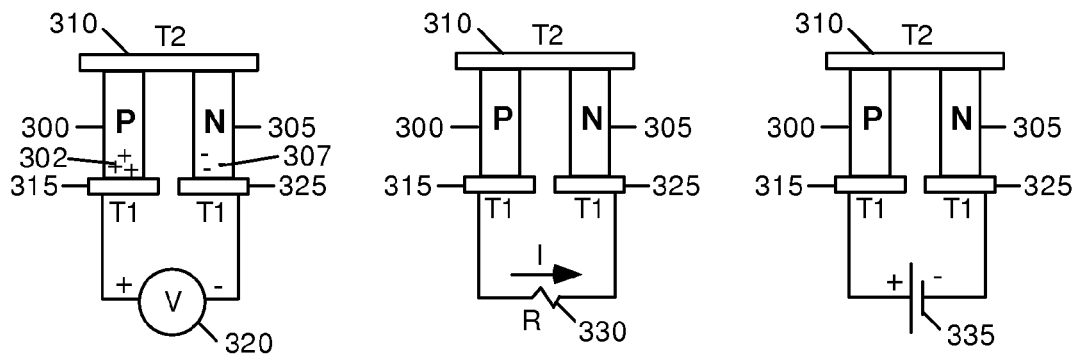
Fig. 3--Prior Art  Fig. 4--Prior Art  Fig. 5--Prior Art

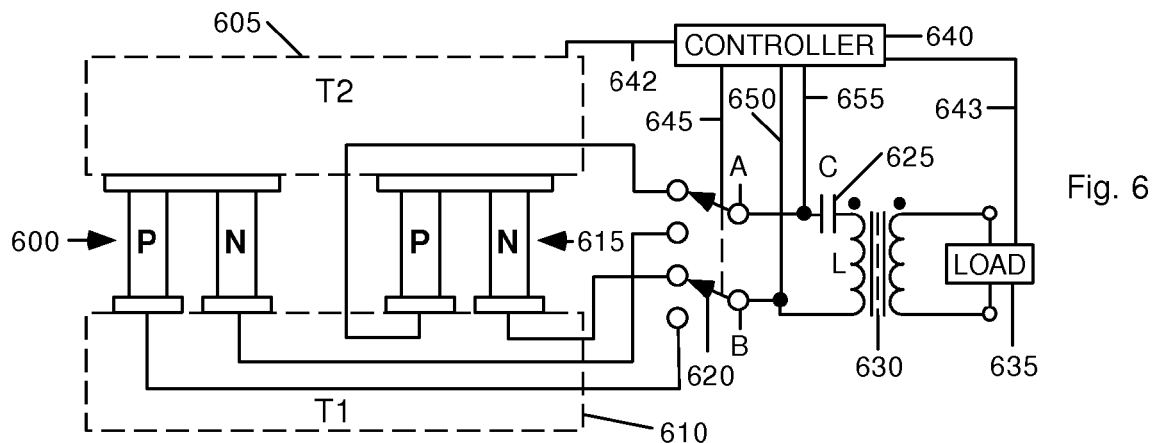
Fig. 6
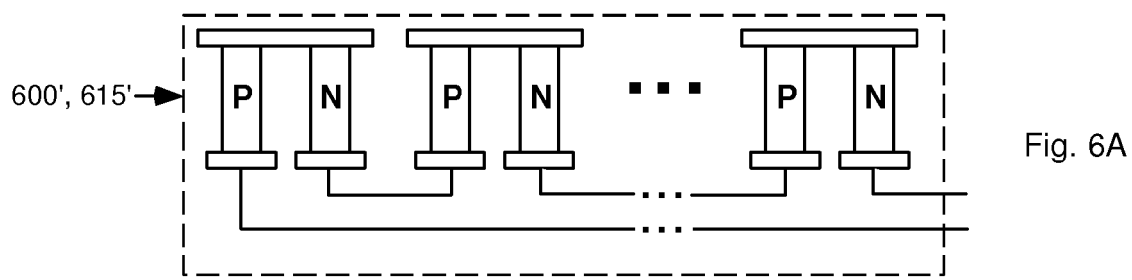
Fig. 6A
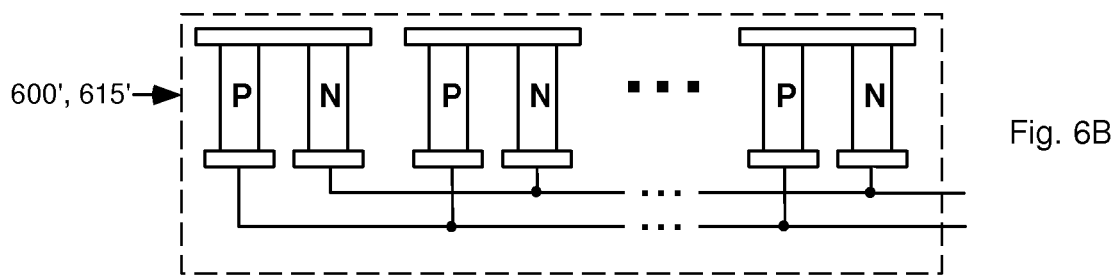
Fig. 6B
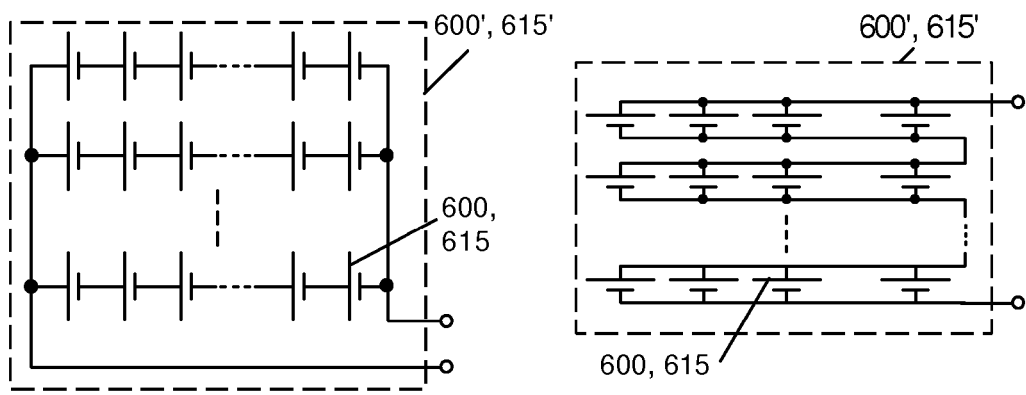
Fig. 6C
Fig. 6D

RESONANT THERMOELECTRIC GENERATOR

BACKGROUND

1. Field of Invention

The present invention relates generally to electric power generators, and in particular to resonant thermoelectric generators.

2. Prior Art—Historical Discoveries

Three solid-state thermoelectric effects are well-known to those skilled in the physical sciences. They are the Seebeck effect, discovered by Thomas Johann Seebeck in 1826, the Peltier effect, discovered by J.C.A. Peltier in 1834, and the Thomson effect, discovered by William Thomson (Lord Kelvin) in 1854.

Seebeck discovered that if the ends of two dissimilar metal conductors are joined and the ends are subjected to different temperatures, a voltage arises that is proportional to the temperature difference. This voltage is measured by breaking one of the conductors and inserting a sensitive voltmeter. This device, in wide use today, is called a thermocouple. The ability of a junction to produce a potential difference arises from differing densities of electrons within the two dissimilar metals.

The voltage developed in a thermocouple is very small, on the order of millivolts. This is sufficient for measurement of temperatures. A number of thermocouples can be combined in series to yield a thermopile that delivers a greater voltage in response to the same temperature gradient. Thermopiles are useful in devices ranging from laser power measurement systems and infrared cameras to power sources.

Peltier discovered that if a current is passed through a thermocouple, such as the one described above, the temperature of one junction increases and that of the other junction decreases.

Thomson discovered that when an electrical current is passed through a material while the material is subjected to a temperature gradient, heat is either evolved or absorbed, depending upon the nature of the material.

In all the above cases, the observed effects are related to temperature differences, or gradients, and electrical properties of materials such as metals and semiconductors. The temperature gradients induce direct-current (DC) electricity in the materials.

Depending upon the materials used, the primary charge carriers that produce the electrical effects can be electrons or holes (the absence of electrons in a lattice). In a metal, the primary charge carrier is electrons.

Semiconductors fall into two categories: n-type and p-type. The terms n-type and p-type refer to the kind of charge carrier that is implanted or diffused within the semiconductor during its manufacture. For example, silicon is first purified then a small amount of antimony is added to provide an excess of electrons within the resulting material. This material is termed n-type because it contains an excess of negatively-charged electrons. Electrical charge is transported within the material by the electrons. On the other hand, when boron is added to purified silicon, the resulting material is deficient in electrons. Electrical charge in this material is carried by "holes", i.e., mobile regions in the material that lack electrons and therefore carry a positive electrical charge.

Charge Carriers Viewed as a Gas

A gas within a container is uniformly distributed when all parts of the container are at one temperature. However, when one side of the container is heated with respect to the opposite side, a concentration gradient will exist within the gas at equilibrium. Gas can be said to evaporate from the hotter side and condense at the colder side. A similar effect happens within metals and semiconductors.

As noted above in connection with the Seebeck effect, electrons move away from the hot end of a conductor and create an electrical gradient which is balanced by current flowing within the conductor. In the case of a semiconductor, the same phenomenon applies to n-type or p-type charge carriers. In an n-type semiconductor that is placed in a thermal gradient, electrons move away from the hot end, creating an electrical charge gradient between the hot and cold ends. In the case of a p-type semiconductor, holes move away from the hot end, creating an electrical charge gradient between the hot and cold ends.

3. Prior Art—Additional Historical Discovery—FIGS. 1 and 2

The concept of heat engines, well-known to those skilled in physical sciences, is used to express the efficiencies of various types of machines. A simplified heat engine 100 is shown conceptually in FIG. 1. Engine 100 is placed in contact with a first thermal reservoir 105 that is held at a temperature T2, and a second thermal reservoir 110 that is held at a temperature T1. Temperature T2 is greater than temperature T1.

Due to the higher temperature of reservoir 105, it supplies heat energy Q2 to engine 100. Engine 100 uses some of this energy Q2 to do work W (e.g., propel a vehicle) and transmits Q1, the rest of energy Q2, to reservoir 110, which is at a lower temperature than engine 100. Work W=Q2−Q1.

In an internal combustion engine, for example, a fuel-air mixture is first drawn into a cylinder through an open intake valve as the piston moves down. The valve then closes and the piston moves upward, compressing the gas adiabatically, i.e., without adding or subtracting heat. Then the mixture is ignited, adding heat isothermally, i.e., at a constant temperature, T2. At the same time, the increase in pressure created by the ignition forces the piston downward, again adiabatically, i.e., without adding or subtracting heat. Finally, an exhaust valve is opened and on its next upstroke, the piston forces the spent exhaust out of the cylinder isothermally, i.e., at temperature T1. By forcing the piston down, the mixture did work on the piston and any other mechanism attached to it.

The efficiency with which the engine operates is expressed as

Efficiency=Work Output/Heat Input, or equivalently,

Efficiency=(Q2−Q1)/Q2.

This concept is often used to express the efficiency of engines that use working gases, such as internal combustion engines and steam engines.

In 1824, Sadi Carnot proposed the Carnot cycle. In the Carnot cycle the heat input to a working fluid is supplied at a single high temperature and all the heat output is rejected at a single lower temperature.

A plot of temperature v. entropy for a Carnot engine is shown in FIG. 2. In this case, the fluid is compressed due to work performed on it: segment C-D. This work is delivered without the gain or loss of heat and is said to be "adiabatic". In segment D-E, the fluid heats isothermally, i.e., at a constant temperature, as heat is added to it at temperature T2. In section E-F, the fluid expands adiabatically as it performs work and its temperature drops from T2 to T1. In segment F-C, the fluid is cooled down isothermally when heat is removed at temperature T1. The difference between the heat added to the fluid and the heat rejected by it is the net work performed by or on the fluid. The work performed during the cycle is represented by the area within the rectangle bounded by line segments C, D, E, and F. The conditions of the Carnot cycle describe an engine that operates at the theoretical highest efficiency possible for a heat engine. No practical engine can achieve this efficiency.

Electrons and holes in a thermoelectric device follow the same rules as fluids in a heat engine. They can be considered the working fluid.

4. Prior Art—Resonant Thermoelectric Generator

In my U.S. Pat. No. 5,770,911 (1998), I show a thermoelectric generator in series with a resonant circuit. When the thermoelectric generator is exposed to a temperature gradient, its output terminals deliver a DC voltage to a switching circuit. This switching circuit contains a plurality of current-sensing switches and diodes. After temporary activation by an external power source, the current-sensing switches cause the output of the thermoelectric generator to be alternately reversed and connected to the ends of a series-resonant electrical circuit. Thus heat, as the result of a thermal gradient applied to the thermoelectric generator, is converted to AC or alternating-current electricity that can be used to power devices connected to the circuit.

SUMMARY

In accordance with one preferred embodiment, a plurality of thermoelectric generators are placed in contact with thermal reservoirs that are held at different temperatures. A switching arrangement temporarily connects each generator in turn to a resonant circuit comprising a capacitor and an inductor. The inductor is the primary of a transformer. The secondary of the transformer provides a usable, alternating-current output.

DRAWING FIGURES

FIG. 1 shows the principal components of a prior-art heat engine.

FIG. 2 is a plot of temperature v. entropy in a prior-art Carnot cycle.

FIGS. 3-5 show prior-art thermoelectric generators connected in various ways.

FIG. 6 shows a two-stage electronic engine circuit according to one aspect of one embodiment.

FIG. 6A shows a series thermocouple connection.

FIG. 6B shows a parallel thermocouple connection.

FIGS. 6C and 6D show series-parallel connections.

REFERENCE NUMERALS

Figure 7:
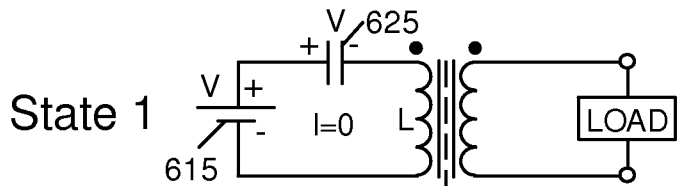
FIGS. 7-10 show various states of operation of the circuit of FIG. 6.

| 100 | Engine |
| 105 | Reservoir |
| 110 | Reservoir |
| 300 | Semiconductor |
| 302 | Holes |
| 305 | Semiconductor |
| 307 | Electrons |
| 310 | Conductor |
| 315 | Terminal |
| 320 | Voltmeter |
| 325 | Terminal |
| 330 | Resistor |
| 335 | Battery |
| 600 | Junction |
| 605 | Reservoir |
| 610 | Reservoir |
| 615 | Junction |
| 620 | Switch |
| 625 | Capacitor |
| 630 | Transformer |
| 635 | Load |
| 640 | Controller |
| 642 | Control line |
| 643 | Control line |
| 645 | Control line |
| 650 | Sense line |
| 655 | Sense line |
| 1100 | Peak |
| 1105 | Peak |
| 1200 | Area |

First Embodiment—Description—FIGS. 3-5—Seebeck and Peltier Systems

A first embodiment uses the Seebeck effect and a pair of semiconductors. The prior-art systems of FIGS. 3-5 will first be explained to aid in understanding this embodiment. A p-type semiconductor 300 (FIG. 3) and an n-type semiconductor 305 are joined by a conductor 310 that is held at a temperature T2. At the opposite end of p-type semiconductor 300 a terminal 315 is held at a temperature T1. Terminal 315 is also connected to a first terminal of a voltmeter 320. Similarly, at the opposite end of n-type semiconductor 305 a terminal 325 is held at temperature T1 and connected to a second terminal of voltmeter 320. When T2 is greater than T1, an excess number of holes 302 (represented by +signs) will migrate, or evaporate, from the hot side of semiconductor 300 at terminal 310. They will collect, or condense, at the cooler side at terminal 315, resulting in a net positive charge at terminal 315. Similarly, an excess number of electrons (−) 307 will migrate away from terminal 310 and toward terminal 325, resulting in a net negative charge at terminal 325. Voltmeter 320 will register a voltage that is directly proportional to the difference between temperatures T2 and T1.

In FIG. 4, a resistor 330 is connected in place of voltmeter 320 (FIG. 3). A direct current will flow through resistor 330 as electrons leave terminal 325, pass through resistor 330, and recombine with holes at terminal 315. The current will be proportional to the difference between temperatures T2 and T1. Because the electrons flow freely through the load from terminal 315 to 325 where they combine with and neutralize the holes, there is negligible build-up of charge of either polarity at terminals 315 and 325. Thus the junction can be said to be a polarized power converter, i.e., thermal power is converted to direct-current voltage and current.

In FIG. 5, a DC source such as a battery 335 is connected between terminals 315 and 325. With the positive terminal of battery 335 connected to terminal 315, holes migrate, or evaporate, away from terminal 315 and toward terminal 310. Because of this, terminal 315 is cooled to a temperature T1, and terminal 310 is heated to a temperature T2. With the negative terminal of battery 335 connected to terminal 325, electrons migrate, or evaporate, away from terminal 325.

Because of this, terminal 325 is also cooled to a temperature T1 and terminal 310 is heated to a temperature T2. With this connection, T2 is greater than T1. The effect is reversible. If the battery polarity is reversed, holes and electrons will move in the opposite directions and T1 will be greater than T2. This is a demonstration of the Peltier effect.

FIG. 6—First Embodiment

A first embodiment based on the foregoing is constructed as shown in FIG. 6. First and second junctions 600 and 615 are placed in thermal contact with a hot reservoir 605 at temperature T2 and a cold reservoir 610 at temperature T1, as shown. Junctions 600 are connected to two poles of a double-pole, single-throw switch 620. Second junctions 615 are connected to switch 620. Junctions 615 are connected to switch 620 so that when poles A and B are in the up position, as shown, terminals A and B are connected to the p-type and n-type sides of junctions 615, respectively. When poles A and B are in the down position (not shown), terminals A and B are connected to the n-type and p-type terminals of junction 600, respectively.

Terminals A and B of switch 620 are connected to the terminals of a series resonant circuit comprising a capacitor 625, having a capacitance value C, and an inductor that is the primary winding of a transformer 630. In lieu of using the primary of the transformer as an inductance, a separate inductor can be used. In this case the power can be extracted from the circuit by placing a load in series or in parallel with the inductor. The matching black dots above transformer 630 indicate that the sense of the primary and secondary windings is the same, i.e., current flowing inward on the top terminal of the primary will cause a current to flow inward on the top terminal of the secondary. The secondary winding of transformer 630 is optionally connected to a load 635. Load 635 receives work performed by the assemblage of circuit elements shown in FIG. 6.

Poles A and B of switch 620 are ganged together, i.e., they switch at the same time. A controller 640 controls the operation of switch 620 through control line 645. Controller 640 senses the voltage across pole A and pole B through sense lines 650 and 655.

The p-type and n-type materials in junctions 600 and 615 can be positively and negatively doped bismuth telluride, respectively, or another suitable material. Alternatively, the materials can be dissimilar metals as discussed above in connection with the Seebeck effect; suitable metals may be, e.g., iron and constantan (nickel and chromium) alloy.

Instead of a single junction as shown in FIG. 6, a thermopile 600', 615' (FIG. 6A) with an assemblage of any number of junctions in serial, or a parallel configuration (FIG. 6B), or a combination of the two, can be substituted for each of junctions 600 and 615 in order to provide additional voltage, current, or both. FIGS. 6C and 6D show examples of series-parallel connections of junctions, represented as sources, combined to yield additional voltage and current. In FIG. 6C, groups of junctions are first connected in series, then each group is connected in parallel. In FIG. 6D, groups of junctions are first connected in parallel, then each group is connected in series. In both cases the electrical output of the combination is increased, when compared to a single junction.

Controller 640 can be a microprocessor having an analog-to-digital converter for sensing the voltage across capacitor 625 pole A and B. A suitable microprocessor is the model 10F220, made by Microchip Technology, Inc., of Chandler, Ariz., USA.

Switch 620 can be an analog switch such as the model MC74LVX4066DR2G, made by On Semiconductor Company of Phoenix, Ariz., USA.

Capacitor C is a low-loss, non-polar capacitor. A typical value is 5 microfarads. A typical transformer 630 has a primary inductance of 0.1 Henry, a turn ratio of 1:1, and a frequency response from 100 Hz to 10 KHz. The present values have been selected for exemplary purposes of discussion only, other values are possible.

First Embodiment—Operation—FIGS. 6 through 12

Reservoirs 605 and 610 are brought to temperatures T2 and T1, respectively. T2 is greater than T1 in this example, although T2 can be less than T1 if required, with no noticeable change in operation of the circuit in FIG. 6.

Switch poles A and B are initially connected to junction 615, as shown in FIG. 6. After all initial transient activity has stopped, capacitor 625 will be charged to an initial voltage V supplied by junction 615. The end of capacitor 625 that is connected to pole A will be positively charged, and the end connected to pole B will be negatively charged. No current is flowing in the primary circuit since the voltage across capacitor C is the same magnitude, but opposite polarity, to that present at the terminals of junction 615.

When switch poles A and B are connected to junction 615, the terminals of junction 600 are disconnected from the remainder of the circuit, i.e., they are an open circuit. As with the voltmeter example in FIG. 3, when no current is flowing through the junction, excess positive and negative charges, 302 and 307 respectively, build up at the T1 terminal ends 315 and 325, respectively.

States of Operation of the Circuit of FIG. 6

The circuit of FIG. 6 operates in four states as follows:

State 1: FIG. 7 shows capacitor fully charged to voltage V, the same as that of junction 615. In this case, controller 640 senses a peak voltage across pole A and B of switch 620'. Instructions within the memory of controller 640 cause it to activate control line 645 to reverse the connection of poles A and B of switch 620, thereby connecting junction 600 in place of junction 615.

Figure 8:
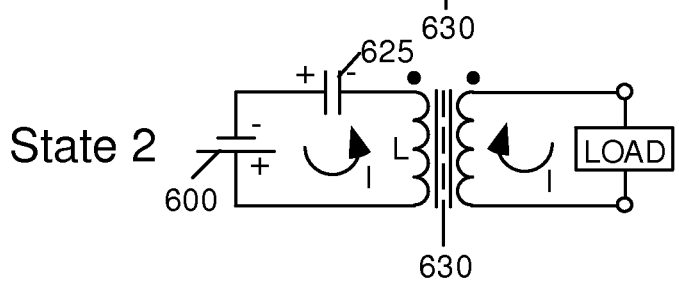
Figure 9:
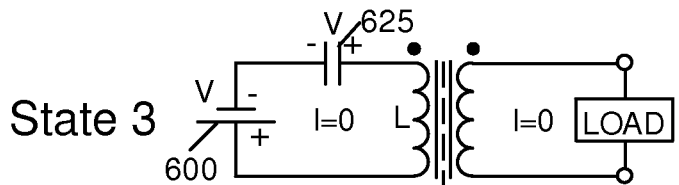
Figure 10:
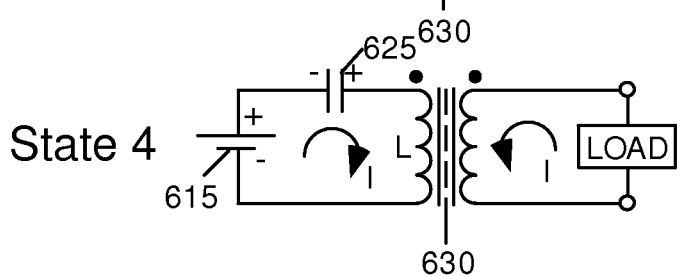
Figure 11:
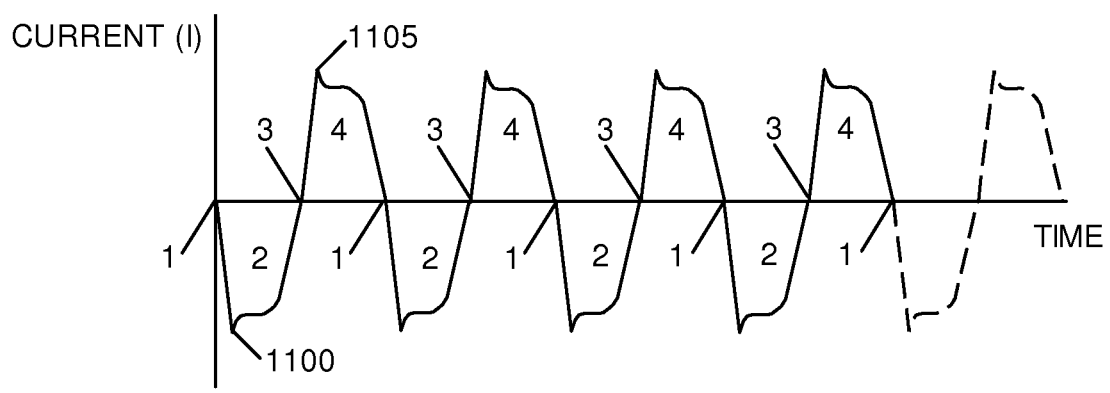
FIG. 11 shows a plot of current v. time for the circuit in FIG. 6.

State 2: FIG. 8 shows the circuit immediately after junction 600 is connected and junction 615 is disconnected. The combined voltages of junction 600 and capacitor 625 initially impress a voltage of 2V across the primary of transformer 630. This causes a transient current I to flow. The waveform of current I in this state is shown in FIG. 11. The state number is indicated within the waveform.

State 3: The voltage across capacitor 625 equals the voltage supplied by junction 600 and current through the primary of transformer 630 has fallen to zero.

State 4: When the current is near zero, controller 640 again switches junction 615 into the circuit and disconnects junction 600. The combined voltages of junction 615 and capacitor 625 impress an initial voltage 2V across the primary of transformer 630, causing a current I to flow in the opposite direction from that in state 2, causing capacitor 625 to charge to the opposite polarity. At this point, the condition for state 1 is reached and controller 640 again connects junction 600 to the circuit and disconnects junction 615, thereby continuing the process of the sequential four states.

The controller operates switch 620 with each half-cycle of the signal across the resonant circuit. Thus the resonant tank is operating under a forced oscillation mode in which the forcing frequency equals or is close to the resonant frequency of the tank. Controller 640 is able to adjust the load or input power by control lines 642 and 643. The frequency of the current can be determined from the formula $$f=1/(2\pi\sqrt{(LC)})$$

where L and C are expressed in units of Henrys and Farads. Thus f, in this example, is equal to approximately 255 Hz. Practical operating frequencies can range from tens of Hz to hundreds of kHz. The optimal choice of frequency depends upon the thermal design of the system.

In a series resonant circuit, the voltage amplitudes across the inductor (L) and capacitor (C) can reach unlimited values. In order to control the output of the generator, additional control lines 642 and 643 are added. Line 642 is connected to circuitry (not shown) to adjust the temperatures T2 of reservoirs 610 and 605, respectively. Line 643 is connected to circuitry (not shown) that varies the strength of load 635, i.e., by causing it to consume more or less power. Controller 640 uses sense lines 650 and 655 to sense the voltage level at terminals A and B. (Switch 620' in FIG. 13 also has similar terminals A and B.) When this level is too great, controller 640 can cause the temperature difference T2−T1 to decrease. When the level is too small, controller 640 can cause the temperature difference T2−T1 to increase. Alternatively, controller 640 can cause the strength of load 635 to increase or decrease, as required. Both temperature and load values can be adjusted according to a predetermined algorithm, if desired. T1 is normally the ambient temperature at which the engine is running. T2 can be adjusted by having a temperature controller (not shown) raise the temperature of a flame by supplying additional combustible materials, for example. Load 635 can be a battery charger and batteries (not shown), for example. Using control line 643, controller 640 can instruct the charger to supply more or less energy for recharging the batteries.

Substantial Additional Advantage

The circuit of FIG. 6 has a substantial additional advantage over the theoretical circuits of FIGS. 3 to 5, as will now be explained. Prior to State 1, a charge gradient is established in the P and N materials forming junction 600. As shown in FIG. 3, when there is no load on the junction, positive charge 302 and negative charge 307 accumulate at the cold ends. When switch 620 is thrown and State 2 begins, this charge is immediately and forcibly extracted from the P and N materials due to the potential across capacitor 625. The additional current in each half cycle due to charges 302 and 307 is shown as peaks 1100 and 1105 (FIG. 11).

Figure 12:
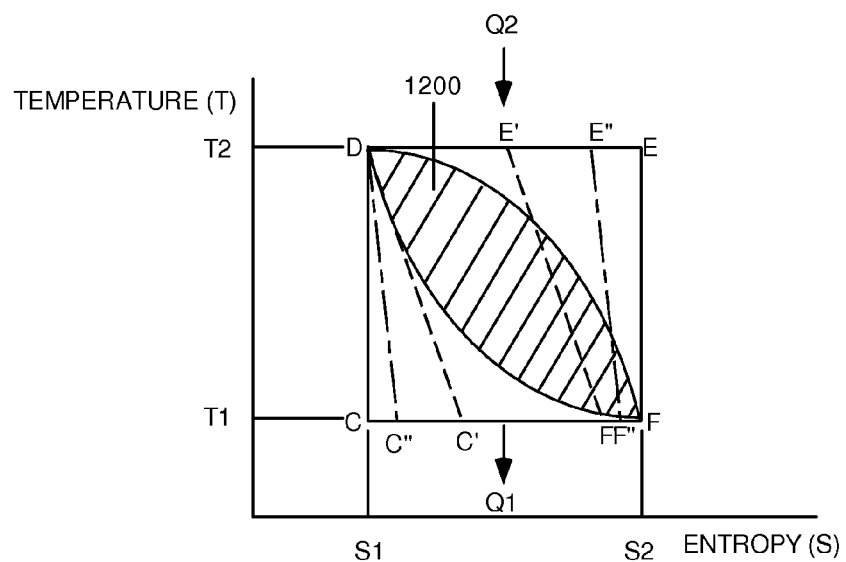
FIG. 12 shows a comparison of the present embodiment with prior-art thermoelectric and Carnot cycle.

In FIG. 12, the area within segments C, D, E, and F is proportional to the amount of work available from a Carnot cycle. As explained above, this amount of work is not achievable in practice due to unavoidable losses in practical systems.

The prior-art, p-n semiconductor junction shown in FIG. 4 delivers DC power to resistor 330. Under these conditions, a very limited cycle results and only a fraction of the available work is extracted from the two thermal reservoirs operating at T1 and T2. This amount of work is indicated by the cross-hatched area 1200 within the plot of FIG. 12. This is the case for the connection shown in FIG. 4, for example. Electrons migrating away from the hot end of the n-type material 305 pass in a steady stream from connection 325, through load 330, and combine with the excess holes that have migrated from connection 310 to connection 315 in p-type material 300. Thus the electrons experience only a limited amount of isothermal heat gain or adiabatic expansion.

When junction 600 or 615 (FIG. 6) is in an open-circuit condition, electrons and holes diffuse toward the cold end of the n-type and p-type semiconductors, respectively. This constitutes heat exchange, equivalent to an isothermal cycle.

When junction 600 or 615 is connected at State 1 or State 3 (FIGS. 7 and 10), the charge on capacitor 620 forces the electrons through the load and to the low-temperature connection in the p-type material where they combine with holes. Thus by using the potential available from capacitor 625 at States 1 and 3, immediately after switch 620 is thrown, charge that has built up isothermally due to the thermal gradient is immediately available, adiabatically, to perform work. The amount of work available from operation of this circuit is indicated by the area enclosed by path D-E'-F'-C'-D, in FIG. 12. A longer isothermal period at each of temperatures T2 and T1 (D-E' and F'-C') accompanied by rapid adiabatic compression (C'-D) and expansion (E'-F') brings about an increase in efficiency available from this circuit. Various circuit losses, transit time of electrons through the circuit and the like slightly reduce the efficiency of the circuit, rendering it less efficient than the theoretical maximum, but more efficient that a prior-art circuit such as shown in FIG. 4.

Figure 13:
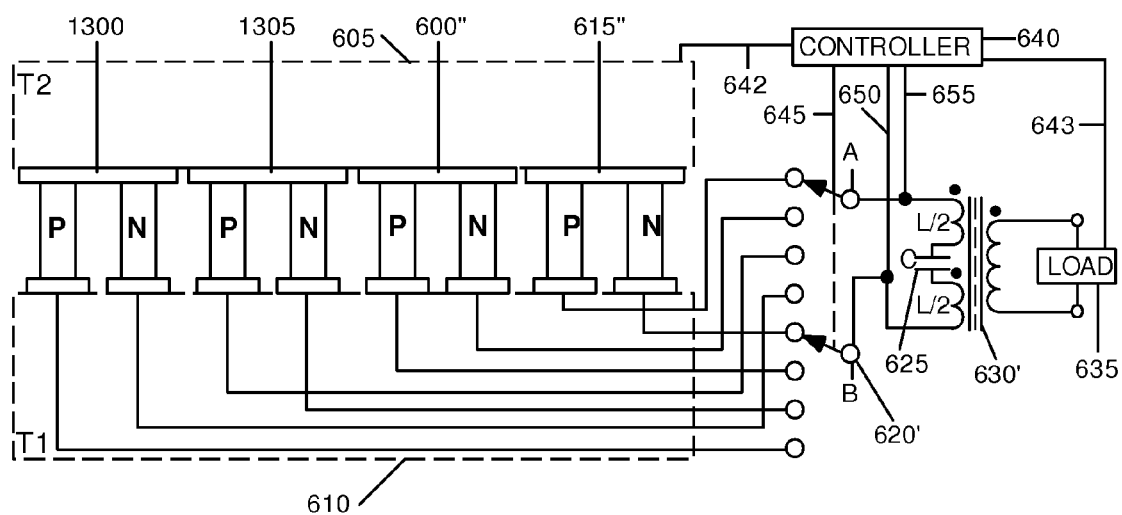
FIG. 13 shows an alternate circuit embodiment.

Second Embodiment—Description and Operation—FIG. 13

When a junction is in the open-circuit condition, holes and electrons diffuse relatively slowly from the hot end of the junction to the cold ends. When the junction is connected to the fully-charged capacitor 625 (FIG. 6), electrons are forcibly driven through the circuit comprising transformer 630 and capacitor 625, resulting in much faster motion of the charge carriers. In other words, the isothermal components of the cycle occur relatively slowly when compared to the adiabatic components which are driven by capacitor 625 when it is fully charged.

Instead of two junctions or thermopiles, as shown above, more can be used. FIG. 13 shows four junctions 600", 615", 1300, and 1305, and an expanded switch 620' having two poles and four throws. This circuit operates in a manner similar to that shown in FIG. 6, except the ratio of OFF to ON times is greater to allow for the fact that the isothermal portion of the cycle takes more time to complete than adiabatic portion. To further extend this concept, adding more junctions and switch throws will allow more time for thermal equilibrium to be established before the adiabatic portion of the cycle is initiated. With two junctions, as in FIG. 6, the ratio of OFF to ON times for a near-sinusoidal output (FIG. 11) is 50%. With four junctions, this ratio is 75%, and so forth. Any number of junctions and switch throws can be used.

In comparison to the circuit in FIG. 6, when this circuit operates at the same frequency and temperature differential, it will provide even more time for isothermal heat gain. The work available from this circuit is indicated in FIG. 12 by the area enclosed in the path D-E", E"-F", F"-C", C"-D. The additional time available for isothermal heat gain is the difference in lengths of path segments C'-F' and C"-F" at temperature T1, and D-E' and D-E" at temperature T2.

In another aspect of this embodiment, transformer 630' is modified to incorporate a split primary winding. Capacitor 625 is connected between the two halves of the primary as shown. Although the electronic circuit is the same, in some aspects there may be a thermodynamic advantage to having the connections of the circuit be symmetrical.

CONCLUSION, RAMIFICATIONS, AND SCOPE

The embodiments shown of my improved resonant thermoelectric generator provide an improvement in efficiency over the prior art. A controller forces operation of a resonant circuit in such a way as to allow sufficient time for isothermal heat flow while causing rapid adiabatic changes once that heat flow is nearly complete.

While the above description contains many specificities, these should not be considered limiting but merely exemplary. Many variations and ramifications are possible. For example, instead of a single thermoelectric junction for each pair of switch poles, two or more junctions can be connected in parallel to increase the magnitude of current available in the cycle. Alternatively, the thermoelectric junctions can be connected in series to form thermopiles, then the thermopiles can be connected in parallel for additional voltage and current. Instead of a semiconductor junction, dissimilar metal junctions or even a combination of semiconductor and one or more dissimilar metal junctions can be used. The inductor can be made using copper wire or a superconductor wire can be used. While specific circuit components and values are shown and discussed, other values and components may be used. For example, a mechanical switch can be used instead of a solid-state switch.

While the present system employs elements which are well known to those skilled in the physical sciences, it combines these elements in a novel way which produces a new result not heretofore discovered. Accordingly the scope of this invention should be determined, not by the embodiments illustrated, but by the appended claims and their legal equivalents.

The invention claimed is:

1. A resonant thermoelectric generator, comprising:
a first circuit including a plurality of polarized thermoelectric power converters operating between two temperature reservoirs,
a switch having a first pole and a second pole, wherein the switch electrically connects and then disconnects each converter between the first pole and the second pole in a continuous sequence so that each time the switch disconnects one converter and then connects another converter, a current between the first pole and the second pole changes direction resulting in an alternating current signal,
a controller for controlling the operation of said switch in response to voltage measured between the first pole and the second pole of said switch,
a second circuit comprising a capacitor and a transformer, the transformer having a primary winding and a secondary winding, said capacitor connected in series with the primary winding between the first pole and the second pole,
a load connected to the secondary winding.

2. The generator of claim 1 wherein said plurality of converters are selected from the group consisting of thermocouples and semiconductor junctions.

3. The generator of claim 1 wherein said controller is arranged to operate said switch at a rate comparable to the resonant frequency of said second circuit.

4. The generator of claim 1 wherein said controller is arranged to control the strength of said load.

5. The generator of claim 1 wherein said controller is arranged to control the temperatures of said reservoirs.

6. The generator of claim 1 wherein said converters comprise a plurality of series-connected converters.

7. The generator of claim 1 wherein said converters comprise a plurality of parallel-connected converters.

8. The generator of claim 1 wherein said converters comprise a plurality of series and parallel connected converters.

9. A resonant thermoelectric generator, comprising:
a first circuit including a plurality of polarized thermoelectric power converters operating between two temperature reservoirs,
switch means for connecting and then disconnecting each converter in the plurality of polarized thermoelectric power converters between a first pole and a second pole in a continuous sequence so that each time the switch means disconnects one converter and then connects another converter, a current between the first pole and the second pole changes direction resulting in an alternating current signal,
a controller for controlling the operation of said switch means in response to voltage measured between the first pole and the second pole,
a second circuit comprising a capacitor and a transformer, the transformer having a primary winding and secondary winding, said capacitor connected in series with said primary winding between the first pole and the second pole,
a load connected to said secondary winding.

10. The generator of claim 9 wherein the primary winding is a split primary winding and said capacitor is connected to a center of said primary winding.

11. The generator of claim 9 wherein said converters are selected from the group consisting of thermocouples and semiconductor junctions.

12. The generator of claim 9 wherein said controller is arranged to operate said switch at a rate comparable to the resonant frequency of said second circuit.

13. The generator of claim 9 wherein said controller is arranged to control the strength of said load.

14. The generator of claim 9 wherein said controller is arranged to control the temperatures of said reservoirs.

15. A resonant thermoelectric generator, comprising:
a first circuit including.
a first temperature reservoir,
a second temperature reservoir,
a first thermoelectric power converter operating between the first temperature reservoir and the second temperature reservoir, and
a second thermoelectric power converter operating between the first temperature reservoir and the second temperature reservoir;
a switch that in a first position connects the first converter to a first pole and to a second pole so that current flows from the first pole to the second pole and that in a second position connects the second converter to the first pole and to the second pole so that current flows from the second pole to the first pole, the switch continuously alternating between the first position and the second position to produce an alternating current signal; and,
a second circuit including a capacitor and an inductor connected in series, the second circuit being connected to the first pole and the second pole of the switch.

16. A resonant thermoelectric generator as in claim 15, wherein the inductor is formed from primary windings of a transformer, and wherein a load is connected to secondary windings of the transformer.

17. A resonant thermoelectric generator as in claim 15 wherein when the first converter is connected to the first pole and to the second pole, the second converter is in an open-circuit condition, allowing for isothermal expansion or compression of electrons within the second converter, and wherein when the second converter is connected to the first pole and to the second pole, the first converter is in an open-circuit condition, allowing for isothermal expansion or compression of electrons within the first converter.

18. A resonant thermoelectric generator as in claim 15 additionally comprising:
  a controller for controlling the operation of the switch in response to voltage measured between the first pole and the second pole.

* * * * *